(12) United States Patent
Yoon

(10) Patent No.: US 6,902,983 B2
(45) Date of Patent: Jun. 7, 2005

(54) METHOD FOR MANUFACTURING SEMICONDUCTOR DEVICE AND CAPACITOR

(75) Inventor: Dong-Soo Yoon, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 58 days.

(21) Appl. No.: 10/288,957

(22) Filed: Nov. 6, 2002

(65) Prior Publication Data

US 2003/0094644 A1 May 22, 2003

(30) Foreign Application Priority Data

Nov. 21, 2001 (KR) .................................. 10-2001-0072623

(51) Int. Cl.⁷ ........................ H01L 21/20; H01L 21/443
(52) U.S. Cl. ...................... 438/396; 438/653; 438/654; 438/685; 438/686
(58) Field of Search .............................. 438/653, 654, 438/685, 686, 396

(56) References Cited

U.S. PATENT DOCUMENTS

| | | | | | |
|---|---|---|---|---|---|
| 6,011,284 | A | * | 1/2000 | Katori et al. | 257/295 |
| 6,015,989 | A | * | 1/2000 | Horikawa et al. | 257/309 |
| 6,133,159 | A | | 10/2000 | Vaartstra et al. | |
| 6,207,232 | B1 | | 3/2001 | Kadokura | |
| 2002/0001971 | A1 | * | 1/2002 | Cho | 438/765 |

FOREIGN PATENT DOCUMENTS

| | | |
|---|---|---|
| JP | 10-022469 | 1/1998 |
| JP | 10-242409 | 9/1998 |

* cited by examiner

Primary Examiner—M. Wilczewski
(74) Attorney, Agent, or Firm—Marshall, Gerstein & Borun LLP

(57) ABSTRACT

A semiconductor devices includes: a diffusion barrier layer composed of ternary compound elements formed on a substrate, wherein the diffusion barrier contains ruthenium, titanium and oxygen; and a capacitor formed on the diffusion barrier layer, wherein the capacitor includes a bottom electrode formed on the diffusion barrier layer, a dielectric layer formed on the bottom electrode and a top electrode formed on the dielectric layer.

15 Claims, 1 Drawing Sheet

METHOD FOR MANUFACTURING SEMICONDUCTOR DEVICE AND CAPACITOR

BACKGROUND

1. Technical Field

A method for manufacturing a semiconductor device and a capacitor is disclosed. More particularly, a method for manufacturing a diffusion barrier layer used in a capacitor is disclosed.

2. Description of the Related Art

In a dynamic random access memory (DRAM) and a ferroelectric RAM (FeRAM), a capacitor is generally composed with a bottom electrode, a high dielectric layer and a top electrode.

Among various semiconductor memory devices, the DRAM is a memory device with excellent integration because one unit cell is composed of one transistor and one capacitor.

With progress in integration technology, a memory capacity of semiconductor device is increased about four times per three years, and currently, 256 Mb DRAM and GB level of DRAM have been developed.

As the integration of DRAM increases, the memory cell dimension decreases. For example, in case of 256 Mb DRAM, the memory cell dimension is 0.5 $\mu m^2$, and in this case, a capacitor dimension, which is one of basic element of a cell, may be smaller than 0.3 $\mu m^2$.

To secure a high capacitance in a small memory cell, a number of methods are utilized. For example, the dielectric layer of the capacitor may be formed with a material having high dielectric constant, or the thickness of the dielectric layer may be reduced, or the surface area of the capacitor may be increased.

To increase the surface area of the capacitor, that is, to increase the surface area of the charge storage electrode, a number of capacitor manufacturing technologies may be utilized, such as stack type capacitor or a trench type capacitor formation technology, or a hemi-spherical polylicon grain formation technology for forming the charge storage electrode. However, the above-mentioned technologies make capacitor structure complicated, and manufacturing process is very intricate, thereby increasing the cost of the product and decreasing the yield.

Generally, $SiO_2/Si_3N_4$ based dielectric materials are used as the capacitor dielectric layer, and there is a technological limit in the method for increasing capacitance by decreasing a thickness of $SiO_2/Si_3N_4$ based dielectric layer.

Therefore, methods for capacitor manufacturing using a high dielectric materials are utilized which employ $Ta_2O_5$, $SrBi_2Ta_2O_9$ (hereinafter, referred to as a SBT) having a perovskite structure, $Pb(Zr, Ti)O_3$ (hereinafter, referred to as a PZT) and $(Bi, La)_4Ti_3O_{12}$ (hereinafter, referred to as a BLT), which have higher dielectric constant than the $SiO_2/Si_3N_4$ based dielectric materials.

Accordingly, to increase memory device integration, the above-mentioned high dielectric materials are used. With the use of the high dielectric materials, the problem of a bottom electrode oxidation is occurred. Therefore, research for forming the bottom electrode with a metal or a conductive oxide material, such as Pt, Ru, $RuO_2$, Ir and $IrO_2$, has been conducted.

Meanwhile, to apply the above-mentioned the metal or the conductive oxide material for forming the bottom electrode, a diffusion barrier layer is necessarily formed between the bottom electrode and a polysilicon plug for connecting the bottom electrode to a semiconductor substrate. A diffusion barrier layer may have a good characteristic in preventing diffusion of oxygen generated in a dielectric formation process, which is processed in an $O_2$ atmosphere at a temperature of over 600° C.

Diffusion barrier layers formed in accordance with conventional methods react with oxygen, nonconductive products are formed due to the oxidation of the diffusion barrier layer, and, as a result, erroneous operation of the capacitor occurs.

SUMMARY OF THE DISCLOSURE

Therefore, a semiconductor device comprising a barrier diffusion barrier capable of preventing oxygen diffusion is disclosed.

A semiconductor device is disclosed that comprises: a diffusion barrier layer composing ternary compound elements formed on a substrate, wherein the diffusion barrier comprises ruthenium, titanium and oxygen; and a capacitor formed on the diffusion barrier layer, wherein the capacitor comprises a bottom electrode formed on the diffusion barrier layer, a dielectric layer formed on the bottom electrode and a top electrode formed on the electric.

A method for manufacturing a semiconductor device capacitor is also disclosed which comprises: a) forming a diffusion barrier layer comprising ruthenium, titanium and oxygen on a substrate; b) annealing the diffusion barrier layer; and c) forming a capacitor by stacking a bottom electrode, a dielectric and a top electrode on the diffusion barrier layer.

BRIEF DESCRIPTION OF THE DRAWINGS

Other aspects of the disclosure will become apparent from the following description of the embodiments with reference to the accompanying drawings, wherein.

DETAILED DESCRIPTION OF THE PRESENTLY PREFERRED EMBODIMENTS

Hereinafter, a method for manufacturing a semiconductor device comprising a capacitor will be described in detail referring to the accompanying drawings.

Figure 1:
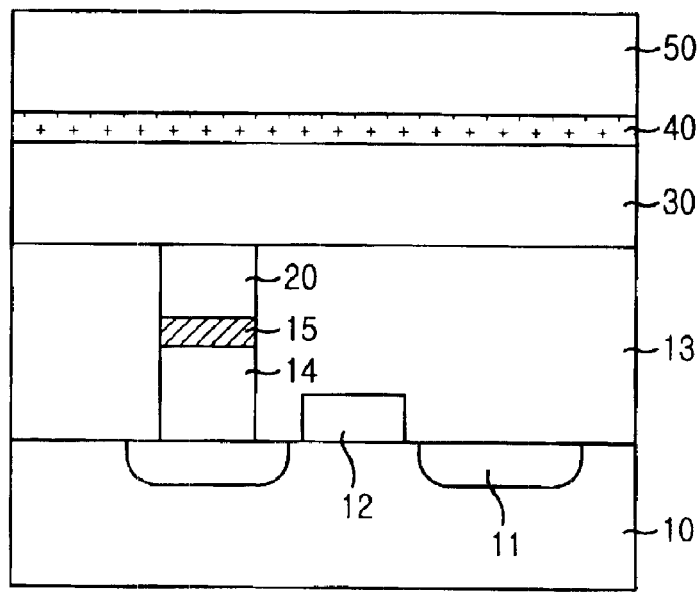
FIGS. 1 and 2 are cross-sectional views illustrating a semiconductor device capacitor in accordance with a disclosed embodiment.
Figure 2:
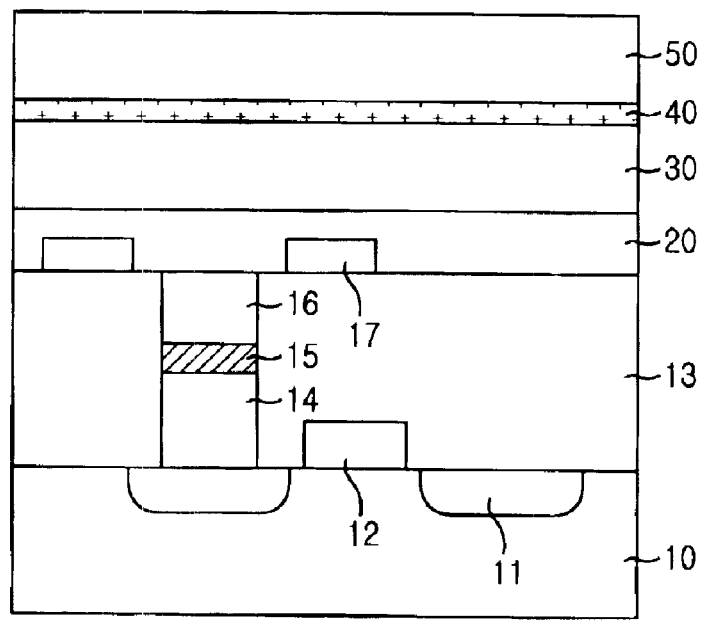

FIGS. 1 and 2 are cross-sectional views illustrating a semiconductor device comprising a capacitor in accordance with disclosed embodiment.

Referring to FIG. 1, the semiconductor device includes a polysilicon plug 14 connected to a source/drain 11 of a transistor, and a titanium silicide 15 generated from the reaction of polysilicon plug 14 and titanium deposited detanium on the polysilicon plug 14. The semiconductor device also includes a diffusion barrier layer 20, which comprises ternary compound elements, i.e., ruthenium-titanium-oxygen, on the titanium silicide 15, and a capacitor having a bottom electrode 30, a dielectric layer 40 and a top electrode 50 stacked on the diffusion barrier layer 20.

The titanium silicide 15 prevents the diffusion of silicon from the polysilicon plug 14 to the bottom electrode 30. The dielectric layer 40 is formed with $Ta_2O_5$, and $SrBi_2Ta_2O_9$ (hereinafter, referred to as a SBT), $Pb(Zr, Ti)O_3$ (hereinafter, referred to as a PZT) and $(Bi, La)_4Ti_3O_{12}$ (hereinafter, referred to as a BLT), which have a perovskite structure, the top and bottom electrodes are formed with Ru, $RuO_2$, Ir or $IrO_2$.

Referring to FIG. 2, the titanium nitride layer 16 is further formed on the titanium silicide 15, and also, a diffusion barrier layer 20, which comprises ternary compound elements, i.e., ruthenium-titanium-oxygen compound. An adhesive layer may be formed on the diffusion barrier layer 20.

Hereinafter, a method for forming a diffusion barrier layer comprising ternary compound elements, i.e., ruthenium-titanium-oxygen will be described in detail.

In the processes for forming the semiconductor device comprising the capacitor, a thermal treatment is carried out at a temperature exceeding 600° C., so oxygen in the dielectric layer 40 is diffused to the outside. Therefore, the diffusion barrier layer 40 should be able to prevent oxygen diffusion and, at the same time, should have a sufficient resistance to oxidation.

To prevent the oxidation of the diffusion barrier layer, there must be strong chemical combination between materials, which form the diffusion barrier layer. After reacting with oxygen, the diffusion barrier layer should maintain a conductive characteristic so not operational problems in the capacitor.

To satisfy the above-mentioned criteria, as a base material for forming a diffusion barrier layer, Ru or Ir are adequate, because the oxidized substances of Ru and Ir are conductive oxide materials and have no problem in electrical connection.

Also, metals may be added to form a strong combination between elements in the diffusion barrier layer, and make an amorphous diffusion barrier layer. The added metals should have thermal stability and affinity to oxygen. Refractory metals have the above-mentioned characteristics. Also, to get a strong chemical combination between the elements in the diffusion barrier layer, oxygen should be added.

The diffusion barrier layer comprising refractory metals and oxygen with Ir or Ru, may form the amorphous structure due to a strong chemical combination of the refractory metals and oxygen, and an amorphous minimum structure can be maintained up to high temperature. Also, after oxidized with react oxygen, the electrical characteristic of a formation of a diffusion barrier layer may not deteriorate due to Ir or Ru.

In an embodiment, Ru is used as a base metal and Ti is used as the adding refractory metal. The diffusion barrier layer is formed by a metal organic chemical vapor deposition (MOCVD) method using Ru precursor and Ti precursor.

The reason of using the MOCVD method is that, with minimization of a semiconductor device, a diameter of a storage node contact hole is being smaller about 0.1 μm, so an excellent gap-fill characteristic may not be obtained by using a conventional physical vapor deposition (PVD).

The diffusion barrier layer may be formed using various reaction gas used in MOCVD method. An oxygen gas may be used as the reaction gas.

In case of using $RuX_2$ as a Ru precursor and $TiX_4$ as a Ti precursor, they are reacting according to the following equations to form a diffusion barrier layer. In here, X means legend, and detailed names of materials are described later.

The oxygen gas reacts with the Ru precursor and the Ti precursor, which make a layer containing Ru, Ti and $O_2$. Reaction products having strong volatile material are a react product having strong volatile characteristic may be easily removed with vacuum pumping. The following Equations 1 and 2 show the respective reaction of $RuX_2$ or $TiX_4$ with $O_2$.

$$RuX_2 + O_2 \rightarrow RuO_A + 2X_BO_2 \qquad \text{Equation 1}$$

$$TiX_4 + O_2 \rightarrow TiO_A + 4X_BO_2 \qquad \text{Equation 2}$$

Besides $RuX_2$ and $RuX_3$ may be used as a Ru precursor, and in this case, $TiX_2$ is used instead of $TiX_4$ as a Ti precursor. The following equations 3 and 4 show the respective reaction of $RuX_3$ or $TiX_2$ with $O_2$.

$$RuX_3 + O_2 \rightarrow RuO_A + 3X_BO_2 \qquad \text{Equation 3}$$

$$TiX_2 + O_2 \rightarrow TiO_A + 2X_BO_2 \qquad \text{Equation 4}$$

Also, in this case, the $O_2$ gas makes a layer containing Ru, Ti, and $O_2$ by reacting with the Ru precursor and the Ti precursor, and the strong volatile reaction products may be easily removed using vacuum pumping.

On the basis of the reaction principle, a detailed embodiment of a method for forming a diffusion barrier layer by a chemical vapor deposition (CVD) will be described in detail.

First, the Ru precursor ($RuX_2$ or $RuX_3$) and the Ti precursor ($TiX_4$ or $TiX_2$) are provided on a substrate heated to a temperature ranging from about 100° C. to about 900° C. with the $O_2$ gas, in order to be absorbed Ru, Ti, and to form RuTiO layer on the surface of a substrate. The RuTiN layer is formed to a thickness ranging from about 200 Å to about 1000 Å. In the RuTiN layer the concentration of Ru ranges from about 50 to about 90 at %, Ti ranges from about 1 to about 50 at % and O ranges from about 1 to about 80 at %.

In case of using $RuX_2$ or $RuX_3$ as the Ru precursor, X is a material selected from the group consisting of H, $C_1$–$C_{10}$ alkyl, $C_2$–$C_{10}$ alkenyl, $C_1$–$C_8$ alkoxy, $C_6$–$C_{12}$ aryl, diketonates, cyclopentadienyl, $C_1$–$C_8$ alkylcyclopentadienyl and halogenated variations thereof.

In case of using $TiX_4$ or $TiX_2$ as the Ti precursor, X is anyone selected from the group consisting of H, $C_1$–$C_{10}$ alkyl, $C_2$–$C_{10}$ alkenyl, $C_1$–$C_8$ alkoxy, $C_6$–$C_{12}$ aryl, diketonates, cyclopentadienyl, $C_1$–$C_8$ alkylcyclopentadienyl and halogenated variations thereof.

As the reaction gas, besides the $O_2$ gas, an oxygen gas and a gas selected the group consisting of $O_2$, $H_2O$, $H_2O_2$, ROH, RCOOH and $C_2$–$C_{10}$ diol may be used. The R of ROH and RCOOH are materials selected from the group consisting of $C_1$–$C_{10}$ alkyl, $C_2$–$C_{10}$ alkenyl, $C_1$–$C_8$ alkoxy, $C_6$–$C_{12}$ aryl and halogenated variations thereof.

Also, a purge gas used in the MOCVD, is selected from the group consisting of $N_2$, He, Ne, Ar, $H_2$ and a combinations thereof.

With the above-mentioned method, after depositing the diffusion barrier layer composed of ternary compound elements, ruthenium-titanium-oxygen, there may be adapted various process to improve the diffusion barrier layer. A process to make surface of a diffusion barrier layer more sense using ion or plasma, and in another process, adding oxygen on a surface of a diffusion barrier layer and forming a uniform oxide layer are may be adapted.

Detailed description of the above-mentioned methods will be described as follows:

First, a quality of a layer may be improved by adding oxygen on the surface of a diffusion barrier layer by carrying out a rapid thermal process (RTP) at a temperature ranging from about 100° C. to about 650° C. and a time period ranging from about 1 to about 5 minutes, in an atmosphere of $O_2$, mixed gas Ar and $O_2$ or $N_2$ and $O_2$.

In case of adding oxygen at an atmosphere of mixed gas Ar and $O_2$ or $N_2$ and $O_2$, a thermal treatment may be carried out with changing a composite ratio of Ar and $O_2$, or $N_2$ and $O_2$.

Besides the above-mentioned method, a method of improving quality of the layer by making the surface of a diffusion barrier layer more dense and forming a uniform oxide layer using an oxide ion. That is, oxygen ions are accelerated toward the substrate on which the diffusion barrier is formed, the surface of a diffusion barrier is bombarded by the oxygen ions at a temperature ranging from about 100° C. to about 650° C. for a time period ranging from about 1 to about 5 minutes, in order to improve the surface density. In this manner, oxygen ions may be used for increasing the surface density and for forming uniform oxide layer.

Besides oxygen ions, other ions may be used for increasing the surface density of the diffusion barrier layer. Ar or $N_2$ is ionized in a chamber, and the surface of the diffusion barrier is bombarded by the Ar or $N_2$ ions at a temperature ranging from about 100° C. to about 650° C. for a time period ranging from about 1 to about 5 minutes, in order to increase the surface density. Thereafter, the surface of the diffusion barrier is treated with oxygen to form a uniform oxide layer. In this case, the oxygen may be ionized simultaneously with Ar and $N_2$, in order to increase the surface density of the diffusion barrier and to form a uniform oxide layer.

In case of improving the surface density using $NH_4$, a thermal treatment is carried out in an atmosphere of $NH_4$ or $NH_4$ plasma at a temperature ranging from about 100° C. to about 650° C. for a time period ranging from about 1 to about 5 minutes, about 1 to about 5 minutes, and a uniform oxide layer is formed with oxygen ions. Also, a uniform oxide layer may be formed with oxygen ions after carrying out thermal treatment using $NH_4$ plasma and oxygen plasma.

Instead of using $NH_4$ plasma or oxygen plasma, an ultra violet (UV) and ozone may be used to increase the surface density of the diffusion barrier layer and to form a uniform oxide layer, in this case, the processes are carried out a temperature ranging from about 100° C. to about 650° C. for a time period ranging from about 1 to about 5 minutes.

The diffusion barrier layer may effectively prevent the diffusion of oxygen generated in processes, namely in a deposition process and in a post treatment process, for forming a high dielectric layer process. Therefore, it is possible to manufacture DRAM and FeRAM devices having an excellent characteristic. Therefore, a capacitor having reliability and good electrical characteristic capacitor may be acquired and it may be used in a current and future semiconductor devices.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for manufacturing a semiconductor device comprising:

forming a diffusion barrier layer comprising ruthenium (Ru), titanium (Ti) and oxygen (O) on a substrate, wherein the diffusion barrier is formed by a metal organic chemical vapor deposition (MOCVD) method;

annealing the diffusion barrier layer; and forming a capacitor by stacking a bottom electrode, a dielectric and a top electrode on the diffusion barrier layer.

2. The method of claim 1, wherein in the diffusion barrier layer the concentration of Ru ranges from about 50 to about 90 at %, Ti ranges from about 1 to about 50 at % and O ranges from about 1 to about 80 at %.

3. The method of claim 1, wherein the diffusion barrier layer is formed with a $RuX_2$ precursor and a $TiX_4$ precursor.

4. The method of claim 3, wherein X is a material selected from the group consisting of H, $C_1$–$C_{10}$ alkyl, $C_2$–$C_{10}$ alkenyl, $C_1$–$C_8$ alkoxy, $C_6$–$C_{12}$ aryl, diketonates, cyclopentadienyl, $C_1$–$C_8$ alkylcyclopentadienyl and halogenated variations thereof.

5. The method of claim 1, wherein the diffusion barrier layer is formed with a $RuX_3$ precursor and a $TiX_2$ precursor.

6. The method of claim 5, wherein X is a material selected from the group consisting of H, $C_1$–$C_{10}$ alkyl, $C_2$–$C_{10}$ alkenyl, $C_1$–$C_8$ alkoxy, $C_6$–$C_{12}$ aryl, diketonates, cyclopentadienyl, $C_1$–$C_8$ alkylcyclopentadienyl and halogenated variations thereof.

7. The method of claim 5, wherein the diffusion barrier is formed with a reaction gas selected from the group consisting of $O_2$, $NH_3$, $H_2O$, $H_2O_2$, ROH, RCOOH and $C_2$–$C_{10}$ diols.

8. The method of claim 7, wherein R is a material selected from the group consisting of $C_1$–$C_{10}$ alkyl, $C_2$–$C_{10}$ alkenyl, $C_1$–$C_8$ alkoxy, $C_6$–$C_{12}$ aryl and halogenated variations thereof.

9. The method of claim 1, wherein a purge gas selected from the group consisting of $N_2$, He, Ne, Ar, $H_2$ and a combination vapor thereof is used in the MOCVD method.

10. The method of claim 1, wherein the diffusion barrier is annealed with a rapid thermal process (RTP) at a temperature ranging from about 100° C. to about 650° C. for a time period ranging from about 1 to about 5 minutes.

11. The method of claim 10, wherein the rapid thermal process (RTP) is performed in an atmosphere selected from the $O_2$, a mixture of Ar and $O_2$ and a mixture of $N_2$ and $O_2$.

12. The method of claim 1, wherein the method further comprises increasing the surface density of the diffusion barrier layer.

13. The method of claim 12, wherein the increasing the surface density is performed with materials selected from the group comprising of oxygen ions, $NH_4$ gas, $NH_4$ plasma, oxygen plasma and mixed ions of oxygen and nitrogen.

14. The method of claim 12, wherein the method further comprises forming an oxide layer on the surface of the diffusion barrier.

15. The method of claim 1, wherein the method further comprises increasing the surface density of the diffusion barrier layer and of forming an oxide layer on the surface of the diffusion barrier.

* * * * *